United States Patent [19]

Azuma et al.

[11] Patent Number: 5,413,838
[45] Date of Patent: May 9, 1995

[54] BOTH-SIDE ROUGHENED COPPER FOIL WITH PROTECTION FILM

[75] Inventors: Keiji Azuma; Kimikazu Katoh, both of Tokyo; Ryoichi Oguro, Imaichi, all of Japan

[73] Assignees: Sumitomo Bakelite Company Limited; Circuit Foil Japan Co., Ltd., both of Tokyo, Japan

[21] Appl. No.: 111,018

[22] Filed: Aug. 24, 1993

Related U.S. Application Data

[63] Continuation-in-part of Ser. No. 893,677, Jun. 5, 1992, abandoned.

[30] Foreign Application Priority Data

Jun. 18, 1991 [JP] Japan .................... 3-145704

[51] Int. Cl.6 ............... B32B 23/02; B32B 3/00; B32B 15/08
[52] U.S. Cl. .................. 428/194; 428/209; 428/215; 428/457; 428/458; 428/475.5; 428/626; 428/650; 428/652; 428/901; 428/414; 428/416; 428/475.8; 428/463; 216/35
[58] Field of Search ............. 428/194, 215, 209, 458, 428/475.5, 626, 650, 652, 457, 901, 463, 414, 416, 475.8; 156/631

[56] References Cited

U.S. PATENT DOCUMENTS

| | | | |
|---|---|---|---|
| 4,323,632 | 4/1982 | Berdan et al. | 428/626 |
| 4,429,348 | 1/1984 | Dean | 361/399 |
| 4,431,710 | 2/1984 | Lifshin et al. | 428/650 |
| 4,661,417 | 4/1987 | Suzuki et al. | 428/607 |
| 4,722,765 | 2/1988 | Ambros et al. | 156/631 |
| 4,902,556 | 2/1990 | Benedict et al. | 428/209 |
| 5,057,169 | 10/1991 | Adelman | 428/322 |
| 5,057,372 | 10/1991 | Imfeld et al. | 428/901 |

FOREIGN PATENT DOCUMENTS 57-20347 2/1982 Japan .

*Primary Examiner*—P. C. Sluby
*Attorney, Agent, or Firm*—Frishauf, Holtz, Goodman & Woodward

[57] ABSTRACT

Disclosed is a both-side roughened copper foil with a protection film, comprising a metal foil as soft as or softer than copper, or an organic type film having a melting point equal to or higher than a lamination temperature, laminated on one side of a copper foil with both sides roughened, the metal foil or organic film being continuously or continually bonded or adhered to the copper foil. It is possible to protect the ruggedness on the roughened surface at the time the both-side roughened copper foil is cut, packed, transported or stacked on another both-side roughened copper foil, simplify the press molding work, and improve the production efficiency particularly in the step of fabricating a copper-clad laminated board for a printed circuit board as well as the quality of the acquired copper-clad laminated board.

27 Claims, 4 Drawing Sheets

BOTH-SIDE ROUGHENED COPPER FOIL WITH PROTECTION FILM

This is a continuation-in-part application of application Ser. No. 07/893,677, filed Jun. 5, 1992, now abandoned.

BACKGROUND OF THE INVENTION

1. Field of the Invention

The present invention relates to a copper foil with both sides roughened, which has a protection film, for use in an inner layer circuit of a multi-layered printed circuit board.

2. Background Information

Methods of producing a copper-clad laminated board (hereinafter abbreviated as "CCLB") for a multi-layered printed circuit board (hereinafter abbreviated as "MLPCB") include press molding of a both-side roughened copper foil (hereinafter abbreviated as "BSRCF") placed on a single prepreg therewith, and press molding of BSRCFs placed on both sides of a lamination of multiple prepregs therewith. The roughening of a copper foil is performed to improve the bonding between the copper foil and the prepreg.

However a BSRCF has such a shortcoming that when it is pressed with a prepreg, fine ruggedness on the roughened surface of the copper foil, which is pressed with a press plate, are likely to be crushed.

To prevent the crushing of ruggedness on the surface of the BSRCF, a metal film such as a copper foil or aluminum foil, or a conventionally used organic film such as polypropylene, polyethylene terephthalate, polyethylene, triphenylpentene or Tedra (trade name of a resin film made by Du Pont) is placed between a press plate and a BSRCF at the time of press molding.

It is however a very troublesome job to laminate the mentioned metal film or organic film on the BSRCF before pressing them in a press molding step. In addition, when the above mentioned organic film is used, the property of separation from the press plate is bad, and when the film is separated from the BSRCF after the press molding, printing of the organic film on the surface of the copper foil would be seen on the electron microscopic level. This printing will have a bad effect upon the subsequent process.

Conventionally, BSRCFs are supplied in a roll or sheet form, so that the ruggedness on the roughened surface may be smashed or foreign matter may stick on the roughened surface, for example, when the BSRCF is cut, packed or transported.

SUMMARY OF THE INVENTION

It is the object of the present invention to provide a BSRCF with a protection film, which can protect the ruggedness on the roughened surface at the time the BSRCF is cut, packed, transported or stacked on another BSRCF, can simplify the press molding, and can improve the production efficiency, particularly in the step of fabricating a CCLB for a printed circuit board as well as the quality of the produced CCLB.

According to this invention, there is provided a both-side roughened copper foil with a protection film, comprising a metal foil as soft as or softer than copper, or an organic film having a melting point equal to or higher than a lamination temperature, laminated on one side of the both-side roughened copper foil, the protection film being continuously or continually bonded or adhered to the copper foil at one edge or both edges thereof.

The present invention provides a protected copper foil product for lamination to at least one prepreg, comprising:
(a) a copper foil having a first roughened side and opposite thereto a second roughened side, the copper foil having two longitudinally extending side edge portions;
(b) an organic protection film disposed over the first roughened side of the copper foil, the organic protection film having a melting point equal to or higher than a temperature at lamination of the at least one prepreg; and
(c) an adhesive which bonds the organic protection film to the first roughened side of the copper foil only at at least one of the longitudinally extending side edge portions of the first roughened side, the organic film not being adhered by adhesive to portions of the first roughened side located between the two longitudinally extending side edge portions of the first roughened side, the adhesive being selected from the group consisting of a cyanoacrylate, an anaerobic adhesive and an epoxy.

DESCRIPTION OF THE PREFERRED EMBODIMENTS

The present invention will be described in detail below.

Figure 1:
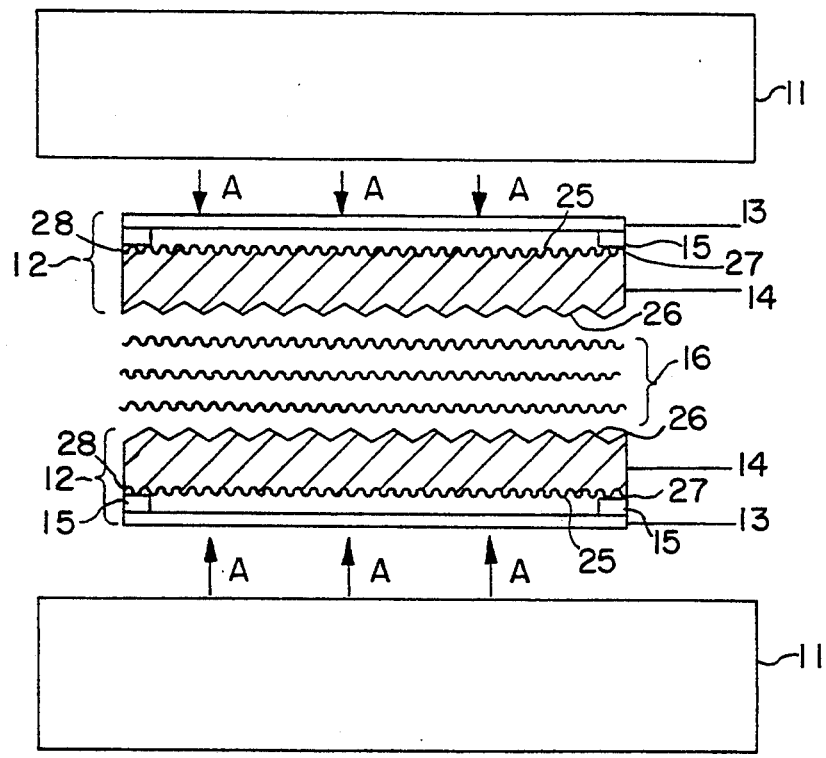
FIG. 1 is a schematic sectional view depicting how a lamination product including copper foil products according to the present invention is made.

As shown in FIG. 1, a press comprising upper and lower press members 11 applies pressure (arrows A show the direction of the applied pressure) to the copper foil products 12. The copper foil products 12 each include an organic protection film 13 adhered to a copper foil 14 by means of an adhesive portion 15 only at at least one of the side edge portions 27 and 28 of the respective copper foil 14. Both opposite surfaces 25, 26 of each of the copper foils 14 are roughened. Prepregs 16 are sandwiched between the copper foil products 12. The product 12 is shown in reduced width form in FIG. 2. FIG. 2a shows the adhesive portion 15 at only one side edge portion 27.

The copper foil 14 is preferably initially furnished in a continuous coil in which both surfaces thereof are subjected to a roughening treatment, i.e., the copper foil is subjected to a cathode electrolytic plating method and is thereafter wound-up in a coil.

Figure 3:
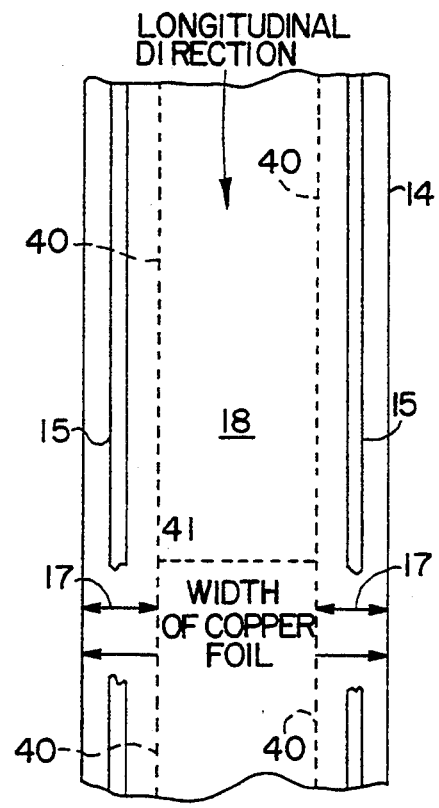
FIG. 3 is a top schematic view taken along line 3—3 of FIG. 2 of a portion of an elongated lamination product with the protection layer removed.

As depicted in FIG. 1, the copper foil products 12 of the present invention can be employed for preparing an inner layer circuit of a multilayered printed circuit board by laminating prepregs 16 between the both-surface roughened copper foils 14. After carrying out a lamination as shown in FIG. 1, one or both edges in the longitudinal direction (including the bonded portion) of the resulting elongated laminated product is/are cut off along dashed line 40 (FIG. 3) in order to obtain a product of a predetermined size (i.e., a printed circuit board) 18 as shown in FIG. 3. Product 18 is obtained by also making transverse cuts as indicated by dashed line 41 in FIG. 3.

By cutting-off the side edge portions 17 including the adhesively bonded portion, there results a laminated product (with the protection film 13 thereon). The protection film 13 can be easily removed (by peeling off) from the product since the adhesive portions 15 have been cut off. The protection film 13 is not shown in FIG. 3 for ease of illustration, but in practice, it is present when side edge portions 17 are cut off. When the laminated product is to be used as an inner layer circuit, the protection film 13 is removed (i.e., peeled off), and other prepregs 16 are laminated (in a second lamination operation) on the now exposed surface 25 (i.e., a surface of the copper foil 14) from which the protection film 13 was removed, by using the same technique as described above.

In the protected copper foil of the present invention, prepregs 16 can be adhered to at least one of the roughened surfaces of the copper foil 14. For a multilayered printed circuit having two sets of prepregs 16, it is necessary for both surfaces of the copper foil 14 to have good adhesive properties with prepregs 16. If a copper foil in which only one surface is subjected to a roughening treatment is used, a good adhesive property on both sides cannot be obtained.

An important feature of the present invention is that the copper foil 14 of the present invention retains good adhesive properties to prepregs 16 due to the presence of the protection film 13 after the first lamination (see FIG. 1). This is because the ruggedness or roughness on the surfaces 25 of the copper foils 14 are protected against being crushed during lamination by the presence of the protection film 13. Also, the protection film 13 is adhered to the copper foil 14 only at one or both side edge portions 27, 28 of the copper foil 14. Thus, by cutting off the adhered edge portion(s) 17 of the foil after the first lamination with prepregs (see FIG. 3), the protection film 13 can easily be removed from the copper foil 14 without leaving a residue of adhesive and the laminated product of the copper foil 14 and the prepregs 16 can be employed for a second lamination with other prepregs.

Figure 2:
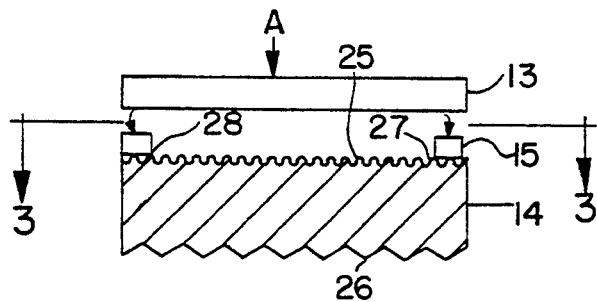
FIG. 2 is a schematic sectional view of a portion of the copper foil product of FIG. 1.
Figure 2A:
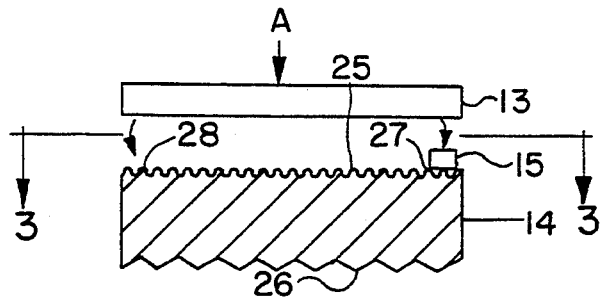
FIG. 2a is a view similar to that of FIG. 2, but showing an adhesive on only one side edge portion of the copper foil product.

The organic protection film 13 is bonded to the both-sides roughened copper foil 14 by adhering one edge or both longitudinal side edges of the protection film 13 to the long (or longitudinal) side edges of the elongated copper foil 14 as shown in FIG. 2. The resulting elongated structure (see FIG. 3) may be rolled in a roll for later use in laminating.

Figure 4:
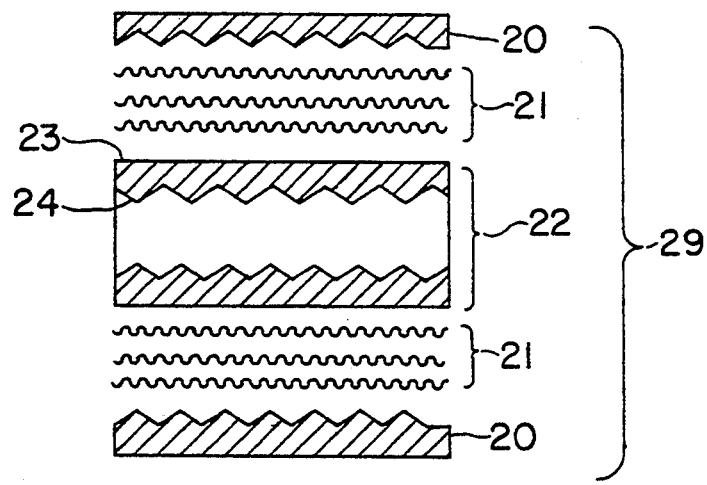
FIG. 4 is a schematic sectional view depicting a four-layered plate according to the prior art.
Figure 6:
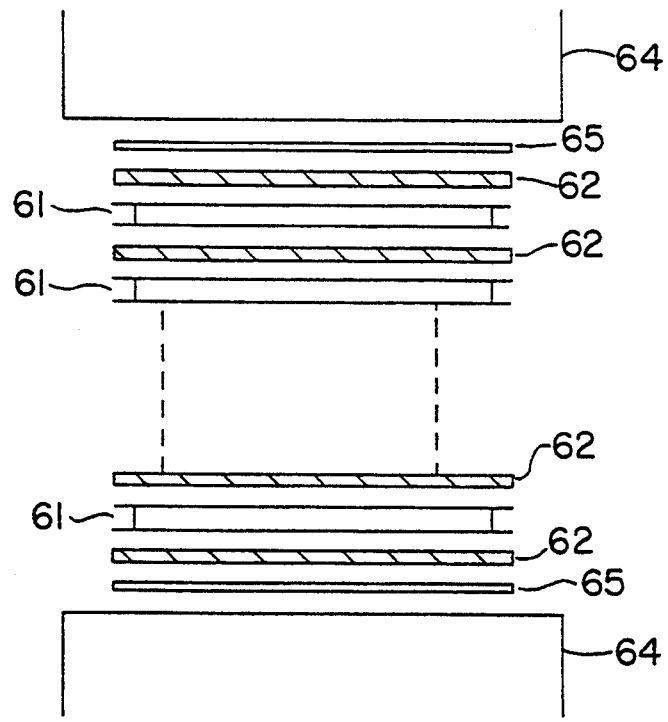
FIG. 6 is a schematic sectional view depicting a prior art mass lamination of a large number of products that can be produced using the present invention.

By using the film-protected copper foil product 12 of the present invention produced as shown in FIG. 1, a final product, i.e., a multi-layered printed circuit board, can be prepared by the conventional processes shown in FIG. 4 and FIG. 6, successively.

FIG. 4 shows a multi-layered plate 29 according to the prior art having copper foil 20, prepregs 21, a laminated plate with copper foil 22 as an inner layer, having a chemically treated (brown oxide or black oxide treatment) surface 23 and a matte or roughened surface 24. The laminated plate with copper foil 22 is similar to the product prepared as shown in FIG. 1. However, FIG. 4 does not show the feature of a both sides roughened copper foil as shown in FIG. 1 and the technique of protecting same.

Figure 5:
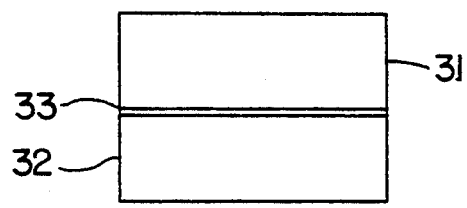
FIG. 5 is a schematic view of a prior product according to Imfeld et al U.S. Pat. No. 5,057,372.

FIG. 5 depicts a prior art structure according to Imfeld U.S. Pat. No. 5,057,372 having carrier sheet 31 and metal foil, for example, copper foil 32 attached thereto at junction portion 33.

For preparing a multi-layer printed circuit board using the present invention, a copper clad laminate (CCL) is firstly prepared as shown in FIGS. 1 to 3 by adhering a protection film 13 provided on a both-sides roughened copper foil 14 ("a first pressing step") by adhesive portions 15. Then, after the CCL is patterned for use as an inner layer circuit, the CCL for an inner circuit such as shown by 22 in FIG. 4 can be subjected to press molding ("a second pressing step") with prepregs such as shown by 21 in FIG. 4 (prepregs 16 are shown in FIG. 1) and copper foils (without a protection film) in the outermost layers, such as shown as 20 in FIG. 4. Between the processes shown in FIG. 4 and FIG. 6, an inner circuit forming process takes place.

Figure 7:
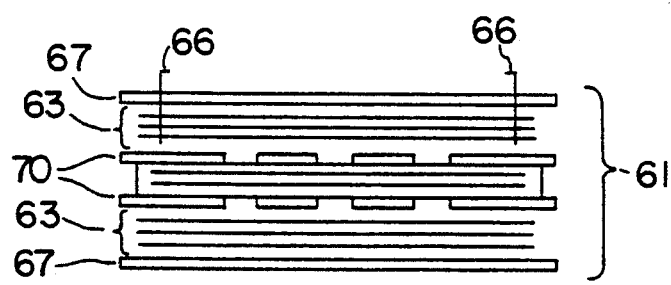
FIG. 7 is a schematic enlarged sectional view of the material 61 to be used for the mass lamination shown in FIG. 6.

In a manner as depicted in FIG. 6, 100 to 300 sets of materials 61 (a product of the process of FIG. 4, i.e., the multi-layer plate 29 in FIG. 4) with a pair of stainless steel plates 62 on opposite surfaces of materials 61 can simultaneously be made. As shown in FIG. 7, the material 61 is made by laminating the inner layer circuit 70, the prepregs 63 and the copper foils 67. Thereafter, the outer layers of the respective molded products are patterned and selectively short circuited, i.e., electrically interconnected by, for example, through-hole plating, with an inner layer circuit to form a multi-layer printed circuit board.

For preparing a multi-layer printed circuit board using the present invention, a copper foil 14 with a protection film 13 of the present invention is prepared in the first pressing step (FIG. 1), and is used for preparing an inner layer circuit of a multi-layered printed circuit board. A second pressing step is carried out by a mass lamination system as shown in FIG. 6 using a plurality of materials obtained by the first pressing step.

In FIG. 6, the materials 61 are located between respective upper and lower stainless steel plates 62, and the assembly is disposed between upper and lower hot presses 64. A cushion material 65 is disposed between the uppermost and lowermost stainless steel plates 62 and the respective upper and lower hot presses 64 as shown in FIG. 6. The cushion material 65 may be made from an elastomeric material, or may specifically be a craft paper or a silicone rubber. There can be, for example 100 to 300 sets (assemblies) of the material 61-stainless steel plates 62. Hot pressing is carried out to laminate the copper foils 67, inner layer circuit 70 and the prepregs 63.

The dashed lines in FIG. 6 represent recurring sets of alternating stainless steel plates 62 and materials 61. After the hot pressing, the four corners (or four sides) of the laminated product are cut-off to a predetermined size (e.g., about 1000 mm×1000 mm, or four sheets of 500 mm×500 mm).

The function of the cushion material 65 is to prevent or reduce the sliding of prepregs or occurrence of voids. Void formation is avoided by pressing the prepregs uniformly via the cushion material 65. Residual air in the prepregs when a thermosetting reaction of the thermosetting resin in the prepregs starts can be effectively exhausted from the four edges of the prepregs, whereby void formation caused by residual air can be avoided. The other effects of the cushion material include a uniform heat transfer speed and a gradual heating and cooling.

The function of the stainless steel plates 62 is to contribute to the improvement in quality of the resulting assembly by pressing the products uniformly, i.e., to classify the product and to cause a uniform smoothness of the surface of the product.

FIG. 7 shows the material 61 comprising copper foils 67 for outer layers (which are not the copper foils 14 as depicted in FIG. 1), prepregs 63 and a copper clad laminate (CCL) as the inner layer circuit 70. FIG. 7 is similar to FIG. 4 in that the copper foils 20 of FIG. 4 correspond to the copper foils 67 in FIG. 7; the prepregs 63 in FIG. 7 correspond to the prepregs 21 in FIG. 4; and the inner layer circuit 70 of FIG. 7 corresponds to the laminated plate 22 in FIG. 4. Lines 66 in FIG. 7 represent "register marks", i.e. the location of a standard hole of a multi-layered printed circuit board for subjecting the resulting printed circuit board to through hole plating.

Figure 8:
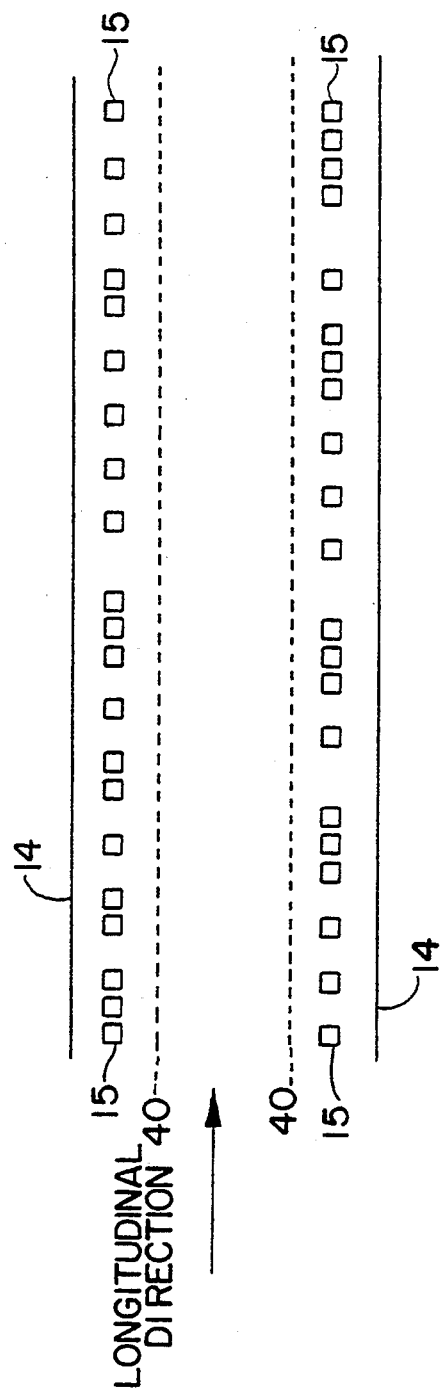
FIG. 8 is a plan view depicting discontinuous application of adhesive.

Whereas FIG. 3 shows the application of a continuous adhesive strip portion 15 (i.e., a continuous strip), FIG. 8 shows the use of discontinuous adhesive strip portions 15 (the discontinuities being shown in FIG. 8 as different on opposite sides of the elongated upper foil 14, by way of example). Any type of discontinuity for adhesive 15 can be provided.

The both sides roughened copper foil (BSRCF) with a protection film according to the present invention has the following advantages.

(1) Since the BSRCF is provided with a protection film, it is possible to prevent the ruggedness on the roughened surface from being smashed, or foreign matter from being stuck on the roughened surface when the BSRCF is cut, packed or transported, or when the copper foil is press-molded with a prepreg or the like.

(2) Because a separate protection film need not be used at the time of press molding, the laminating pressing can be simplified.

(3) When the protection film is separated from the BSRCF after the laminating pressing, residual fragments of the protection film will not stick on the roughened surface since the adhered portions are cut off before removal of the protection film (see FIG. 3).

(4) The protection film is adhered to the copper foil only at one edge or both side edge portions, so that adhesive material on the roughened surface is minimized.

(5) The production efficiency and quality are improved; especially in the fabrication of a CCLB for a printed circuit board.

Available as a BSRCF, which is used in the present invention, are those acquired by subjecting an electrodeposited copper foil or a rolled copper foil to cathode processing in a copper sulfate bath of a sulfuric acid to thereby have coarse particles stuck on its surfaces (see Japanese Patent Publication Nos. 38053/79 and 39327/78), and subjecting the same to anode processing in an acidic bath for etching both surfaces of the copper foil so that the copper foil has toughened surfaces (see Japanese Patent Publication No. 54592/86).

The ruggedness on those BSRCFs are minute projections whose size is a Rz value specified in JIS B 0601. The Rz value is, for example, 2 to 8 μm for an electrodeposited copper foil or rolled copper foil having its lustrous surface subjected to cathode processing, about 0.4 μm for the same foil having its lustrous surface etched to have a roughened surface, 6 to 15 μm for an electrodeposited copper foil having its lusterless surface subjected to cathode processing, and 4 to 8 μm for the same foil having its lusterless surface etched to have a roughened surface.

Determination of Ten-Point Mean Roughness roughness shall be the value of difference, being expressed in micro-meter (μm), between the mean value of altitudes of peaks from the highest to the 5th, measured in the direction of vertical magnification from a straight line that is parallel to the mean line and that does not intersect the profile, and the mean value of altitudes of valleys from the deepest to the 5th, within a sampled portion, of which length corresponds to the reference length, from the profile.

In the definition of the ten-point mean roughness, it requires a certain extent of time from measurement to calculation, because the ten-point mean roughness is to be determined from the difference, obtaining respective mean values by measuring five altitude values, from the highest (deepest) to the 5th, on the sampled portion of the profile. In a profile obtained from an actual processing surface, generally no significant difference is recognized between the value which has been indicated by the difference, Obtaining a median in lieu of a mean value, and the ten-point mean roughness value.

Furthermore, it is clarified chat the time required for measurement and calculation can be reduced remarkably.

In the case where the surface to be measured is a curved surface, the ten-point mean roughness shall be obtained along a curve expected to appear on a cut end.

Reference Length

The reference length, in the determination of the ten-point mean roughness, shall generally be the following six kinds: 0.08, 0.25, 0.8, 2.5, 8, 25 Unit: mm Standard Values of Reference Length The standard values of the reference lengths, unless otherwise required to designate, shall conform to the division of Table A.

TABLE A

| Standard Values of Reference Lengths in Determining Ten-Point Mean Roughness | | |
|---|---|---|
| Range of ten-point mean roughness | | Reference length |
| Exceeding | Max. | mm |
| — | 0.8 μm $R_z$ | 0.25 |
| 0.8 μm $R_z$ | 6.3 μm $R_z$ | 0.8 |
| 6.3 μm $R_z$ | 25 μm $R_z$ | 2.5 |
| 25 μm $R_z$ | 100 μm $R_z$ | 8 |
| 100 μm $R_z$ | 400 μm $R_z$ | 25 |

Remark:

The ten-point mean roughness shall be determined on designating the reference length at first. In the case where the indication and designation of the surface roughness are to be carried out, because it is inconvenient to designate this on all such occasions, unless otherwise required to designate, the value of this Table shall be used.

Indication of Ten-Point Mean Roughness ($R_z$)

Designation of Ten Point Mean Roughness

The designation of the mean roughness shall be as the following:

| Ten-point mean roughness_$\mu$m | Reference length_mm |
|---|---|
| or | |
| _$\mu$m $R_z$ | L_mm |

Preferred Number Series of Ten-Point Mean Roughness

In the designation of the surface roughness by the ten-point mean roughness, unless otherwise required, the preferred number series of Table B shall be used.

TABLE B

| Preferred Number Series of Ten-Point Mean Roughness | | | |
|---|---|---|---|
| 0.05 | 0.8 | 12.5 | 200 |
| 0.1 | 1.6 | 25 | 400 |
| 0.2 | 3.2 | 50 | — |
| 0.4 | 6.3 | 100 | — |

Maximum Value Designation for Ten-Point Mean Roughness

In designating the surface roughness by the permissible maximum value for the ten-point mean roughness, it shall be indicated by suffixing Z after the numerical value selected from the preferred number series of Table B.

Remarks

1. The permissible maximum value mentioned here shall be an arithmetic mean value of $R_z$ at several places randomly sampled from a designated surface, and shall not be the individual maximum value.

2. The maximum value designation of the ten-point mean roughness, for example, 6.3 Z means 0 $\mu$m$R_z \leq 6.3$ Z $\leq 6.3$ $\mu$m$R_z$.

3. For the reference length, in the case of the maximum value designation of the ten-point mean roughness, a value corresponding to the maximum value in Table B shall generally be used. When any reference length other than this value is to be used, the value shall be appended.

Sectional Designation for Ten-Point Mean Roughness

When it is required to designate the ten-point mean roughness in a certain section, numerical values corresponding to the upper limit (the larger value of the designated values) and the lower limit (the smaller value of the designated values) shall be selected from Table B and be stated together.

Example 1:
If Standard Values for Reference Length of Upper Limit and Lower Limit (Table A) are Equal The sectional designation for the upper limit 6.3 $\mu$m$R_z$ and lower limit 1.6 $\mu$m$R_z$ shall be indicated as (6.3 to 1.6)Z. In this case, 0.8 mm shall be used for the reference length.

Example 2:
If Standard Values for Reference Length of Upper Limit and Lower Limit (Table A) Are Different The sectional designation for the upper limit 25 $\mu$m$R_z$ and the lower limit 6.3 $\mu$m$R_z$ shall be indicated as (25 to 6.3)Z. In this case, it means that the ten-point mean roughness measured In the reference length of 2.5 mm is 25 $\mu$m$R_z$ or under, and that the ten-point mean roughness measured in the reference length of 0.8 mm is 6.3 $\mu$m$R_z$ or over.

Remarks

1. If it is required to equalize the reference lengths corresponding to the upper and lower limits or if any reference length other than the standard value of Table A, the reference length shall be scared together. In the case of Example 2, if the reference length corresponding to the upper and lower limit is to be taken as 2.5 mm, it shall be designated as (25 to 6.3)Z, $\angle$2.5 mm.

2. The ten-point mean roughness of the upper and lower limits mentioned here shall be an arithmetic mean value of $R_z$ on several places randomly sampled from the designated surface, and shall not be the individual maximum value.

The metal foil 14 for use in this invention is preferably an electrodeposited copper foil, a rolled copper foil or an aluminum foil, and the thickness of this foil, though not particularly restricted, is preferably between 18 $\mu$m to 70 $\mu$m.

An organic film 13 to be used in this invention is not particularly restricted as long as its melting point is equal to or higher than the lamination temperature. Since the press molding is generally done at a heated temperature of 170° C. or higher, under a pressure of 10 kgf/cm$^2$ or higher and for 60 minutes or longer, it is preferable to use an organic film having a melting point of 170° C. or higher in order to prevent part of the film from sticking on the ruggedness of the BSRCF or being fused on the press plate. A preferable organic film is a polyamide-type resin film having a melting point of 170° C. or higher; NYLON 6 expressed by a chemical formula of ($-NH(CH_2)_5CO-)_n$ and NYLON 66 expressed by a chemical formula of ($-NH(CH_2)_6NH-CO(CH_2)_4CO-)_n$ are more preferable. The measurement of the melting point of polyamide is conducted by ASTMD 2117-64.

The thickness of the organic film 14, though not particularly restricted, is preferably between 10 $\mu$m to 100 $\mu$m for easier handling.

A BSRCF with a protection film according to the present invention can be produced by continuously or continually bonding the metal foil or organic film to the copper foil at one edge or both edges thereof by means of bond or adhesive. When the protection film is bonded to the whole surface of the BSRCF by bond or adhesive, the bond or adhesive not only remains on the ruggedness of the surface of the BSRCF after the protection film is separated therefrom, but also the stuck bond or adhesive undesirably fill dents of the ruggedness.

The bond or adhesive to be used in this invention may be a cyanoacrylate-type instantaneous adhesive 15 agent, an anaerobic adhesive, an epoxy-type adhesive or a pressure sensitive adhesive double coated tape. The bonding or adhering width (horizontal direction in FIGS. 1 and 2) using such adhesive, though not particularly restricted, is preferably 5 to 15 mm.

EXAMPLES

Embodiments of the present invention will be more specifically described below.

EXAMPLE 1

While slitting a BSRCF (35 μm in thickness, a product of Circuit Foil Japan Co., Ltd.) to 1100 mm in width, an electrodeposited copper foil (protection film), 18 μm in thickness, was placed over the lustrous side of the BSRCF [Rz value: 5.5 μm (cathode processing)], was continuously adhered thereto 10 mm wide at both edges thereof by means of an anaerobic adhesive, and rolled to yield a BSRCF with a protection film.

After the produced BSRCF with a protection film was cut into sheets, a lamination of four glass epoxy prepregs, EI-6765 [(resin content of 45%), 180 μm in thickness; a product of Sumitomo Bakelite Co., Ltd.], was placed on that roughened surface having no protection film thereon, and the top and bottom of the resultant structure were held by press plates and heated and press-molded at a temperature of 170° C. for 180 minutes.

Then, the press plates were removed, and an evaluation was made on the following items. The results of the evaluation are shown in Table 1.

Easiness of peeling of protection film from roughened surface

○ represents easy separation of the protection film from the BSRCF without separation resistance.

Shape of ruggedness on roughened surface

The shape of the ruggedness on the roughened surface without the protection film was observed with an electron microscope (magnification: x 2000).

Remainder on roughened surface

After the protection film was separated, the presence or absence of any remainder on the roughened surface was checked with an electron microscope (magnification: x 2000).

EXAMPLE 2

A BSRCF with a protection film was produced in the same manner as Example 1 except that a rolled copper foil with a thickness of 35 μm was used as the protection film in place of the electrodeposited copper foil, and an evaluation was made on the easiness of peeling of the protection film from the roughened surface, the shapes of the ruggedness on the roughened surface, and the remainder thereon. The results of the evaluation is presented in Table 1.

EXAMPLE 3

A BSRCF with a protection film was produced in the same manner as Example 1 except for the replacement of the electrodeposited copper foil with a rolled aluminum foil, 40 μm in thickness, as the protection film, and an evaluation was made on the easiness of peeling of the protection film from the roughened surface, the shapes of the ruggedness on the roughened surface, and the remainder thereon. The results of the evaluation is presented in Table 1.

EXAMPLE 4

A BSRCF with a protection film was produced in the same manner as Example 1 except for the replacement of the electrodeposited copper foil with a film of NYLON 6 (melting point: 220° C.), 20 μm in thickness, as the protection film, and an evaluation was made on the easiness of peeling of the protection film from the roughened surface, the shapes of the ruggedness on the roughened surface, and the remainder thereon. The results of the evaluation is presented in Table 1.

EXAMPLE 5

A BSRCF with a protection film was produced in the same manner as Example 1 except for the replacement of the electrodeposited copper foil with a film of NYLON 66 (melting point: 230° C.) 25 μm in thickness, as the protection film, and an evaluation was made on the easiness of peeling of the protection film from the roughened surface, the shapes of the ruggedness on the roughened surface, and the remainder thereon. The results of the evaluation is presented in Table 1.

COMPARATIVE EXAMPLE 1

Prepregs were placed over a BSRCF without a protection film and the resultant structure was heated and press-molded in the same manner as Example 1, and an evaluation was made on the easiness of peeling of the protection film from the roughened surface, the shapes of the ruggedness on the roughened surface, and the remainder thereon. The results of the evaluation is presented in Table 1.

TABLE 1

|  | Material for Protection Film | Easiness of Peeling | Shape of Ruggedness on Copper Foil | Remainder on Copper Foil |
| --- | --- | --- | --- | --- |
| Example 1 | Electrodeposited copper foil | ○ | No change | none |
| Example 2 | Rolled copper foil | ○ | No change | none |
| Example 3 | Aluminum foil | ○ | No change | Slight |
| Example 4 | NYLON 6 | ○ | No change | None |
| Example 5 | NYLON 66 | ○ | No change | None |
| Comparative Example 1 | none | — | Rupture occurred | None |

The BSRCF with a protection film according to the present invention has the following advantages.

(1) Since the BSRCF is provided with a protection film, it is possible to prevent the ruggedness on the roughened surface from being smashed, or foreign matter from being stuck on the roughened surface when the BSRCF is cut, packed or transported, or when the copper foil is press-molded with a prepreg or the like.

(2) Because a separate protection film need not be used at the time of press molding, the press molding can be simplified.

(3) When the protection film is separated from the BSRCF after press molding, no residual fragments of the protection film will stick on the roughened surface.

(4) The protection film is bonded or adhered to the copper foil only at one edge or both edges, so that the remainder of the bond or adhesive hardly sticks on the roughened surface.

(5) Therefore, it is possible to improve the Production efficiency, particularly in the step of fabricating a CCLB for a printed circuit board and improve the quality of the produced CCLB for a printed circuit board.

EXAMPLE 6

A copper foil in the form of a continuous coil (which has a length of about 1000 to 2000 m) is cut in the form of a sheet with a size of, for example, about 1060 to 1100 m/m × 1050 mm, and placed into a press in a state that a protective film is still attached to the copper foil. The copper foil is combined with prepregs and pressing is carried out. During the pressing, several pairs of copper foil and prepregs are pressed together (for example, 100 to 300 pairs). Thereafter, four corners (or four sides) of the sheet are cut-off at a predetermined size (e.g. about 1000 mm × 1000 mm, or four sheets of 500 mm × 500 mm). At this time, the adhered portions at the both side edge portions are cut-off and the protective film can be easily removed since no adhered portion exits.

What is claimed is:

1. A protected copper foil product for lamination to at least one prepreg, comprising:
    (a) a copper foil having a first roughened side and opposite thereto a second roughened side, the copper foil having two longitudinally extending side edge portions;
    (b) an organic protection film disposed over the first of said roughened sides of said copper foil, said organic protection film having a melting point equal to or higher than a temperature at lamination of said at least one prepreg; and
    (c) an adhesive which bonds said organic protection film to said first roughened side of said copper foil only at at least one of said longitudinally extending side edge portions of said first roughened side, said organic protection film not being adhered by adhesive to portions of said first roughened side located between said two longitudinally extending side edge portions of said first roughened side.
    said adhesive being selected from the group consisting of a cyanoacrylate, an anaerobic adhesive and an epoxy.

2. The copper foil product of claim 1, wherein said protection film is bonded to said copper foil at both longitudinally extending side edge portions thereof.

3. The copper foil product of claim 1, wherein the protection film is a polyamide type resin having a melting point of 170° C. or higher.

4. The copper foil product of claim 3, wherein the polyamide type resin is selected from the group consisting of NYLON 6 and NYLON 66.

5. The copper foil product of claim 4, wherein the organic film has a thickness of 10 $\mu$m to 100 $\mu$m.

6. The copper foil product of claim 1, wherein the film is continuously adhered by the adhesive to one longitudinally extending side edge portion or both longitudinally extending side edge portions of the copper foil.

7. The copper foil product of claim 1, wherein the copper foil is an electrodeposited copper foil or a rolled copper foil having a lustrous surface thereof subjected to cathode processing, and wherein the copper foil has a Rz value of 2 to 8 $\mu$m.

8. The copper foil product of claim 1, wherein the copper foil is an electrodeposited copper foil or a rolled copper foil having a lustrous surface thereof etched to have a roughened surface and wherein the copper foil has a Rz value of about 0.4 $\mu$m.

9. The copper foil product of claim 1, wherein the copper foil is an electrodeposited copper foil having a lusterless surface thereof subjected to cathode processing and wherein the copper foil has a Rz value of 6 to 15 $\mu$m.

10. The copper foil product of claim 1, wherein the copper foil has a lusterless surface which is etched to have a roughened surface and wherein the copper foil has a Rz value of 4 to 8 $\mu$m.

11. The copper foil product of claim 1, wherein the protection film is a polyamide resin film having a melting point of 170° C. or higher and having a thickness of from 10 $\mu$m to 100 $\mu$m.

12. The copper foil product of claim 1, wherein the at least one longitudinally extending side edge portion of said copper film which is adhesively bonded to said organic protection film has a width of 5 to 15 mm.

13. The copper foil product of claim 1, wherein the copper foil which is roughened on both sides thereof is obtained by applying cathode electrolytic plating to a first side and opposite thereto a second side of the copper foil product.

14. A protected copper foil product comprising:
    (a) a copper foil having a first roughened side and opposite thereto a second roughened side, the copper foil having two longitudinally extending side edge portions;
    (b) at least one prepreg laminated to said first or second roughened sides of the copper foil;
    (c) an organic protection film disposed over the first of said roughened sides of said copper foil, said organic protection film having a melting point equal to or higher than a temperature at lamination of said at least one prepreg; and
    (d) an adhesive which bonds said organic protection film to said first roughened side of said copper foil only at at least one of said longitudinally extending side edge portions of said first roughened side, said organic protection film not being adhered by adhesive to portions of said first roughened side located between said two longitudinally extending side edge portions of said first roughed side, said adhesive being selected from the group consisting of a cyanoacrylate, an anaerobic adhesive and an epoxy.

15. The protected copper foil product of claim 14, wherein said organic protection film is bonded to said first roughened side of said copper foil at both longitudinally extending side edge portions of said copper foil.

16. The protected copper foil product of claim 14, wherein said organic protection film is bonded to said first roughened side of said copper foil at only one of said longitudinally extending side edge portions of said copper foil.

17. The protected copper foil product of claim 14, wherein the roughening on each of the first roughened side and opposite thereto on the second roughened side of the copper foil is obtained by applying cathode electrolytic plating to said first side and to said second side.

18. The protected copper foil of claim 14, wherein the organic protection film is a polyamide type resin having a melting point of 170° C. or higher.

19. The protected copper foil product of claim 18, wherein the polyamide type resin is selected from the group consisting of NYLON 6 and NYLON 66.

20. The protected copper foil of claim 19, wherein the organic protection film has a thickness of 10 $\mu$m to 100 $\mu$m.

21. The protected copper foil product of claim 18, wherein the organic protection film is continuously adhered by the adhesive to one longitudinally extending side edge portion or both longitudinally extending side edges of the copper foil, and the organic film.

22. The protected copper foil product of claim 18, wherein the copper foil is an electrodeposited copper foil or a rolled copper foil having a lustrous surface thereof subjected to cathode processing, and wherein the copper foil has an Rz value according to JIS B 0601 of 2 to 8 μm.

23. The protected copper foil product of claim 18, wherein the copper foil is an electrodeposited copper foil or a rolled copper foil having a lustrous surface thereof etched to have a roughened surface and wherein the copper foil has an Rz value according to JIS B 0601 of about 0.4 μm.

24. The protected copper foil product of claim 18, wherein the copper foil is an electrodeposited copper foil having a lusterless surface thereof subjected to cathode processing and wherein the copper foil has an Rz value according to JIS B 0601 of 6 to 15 μm.

25. The protected copper foil product of claim 18, wherein the copper foil has a lusterless surface which is etched to have a roughened surface and wherein the copper foil has an Rz value according to JIS B 0601 of 4 to 8 μm.

26. The protected copper foil product of claim 18, wherein the organic protection film has a thickness of from 10 μm to 100 μm.

27. The protected copper foil product of claim 18, wherein the at least one longitudinally extending side edge portion of said copper film which is adhesively bonded to said organic protection film has a width of 5 to 15 mm.

* * * * *